United States Patent
Ninomiya et al.

(10) Patent No.: US 8,759,801 B2
(45) Date of Patent: Jun. 24, 2014

(54) ION IMPLANTATION APPARATUS AND ION IMPLANTATION METHOD

(71) Applicant: SEN Corporation, Tokyo (JP)

(72) Inventors: Shiro Ninomiya, Tokyo (JP); Mitsukuni Tsukihara, Tokyo (JP); Tetsuya Kudo, Tokyo (JP); Tatsuya Yamada, Tokyo (JP)

(73) Assignee: Sen Corporation, Tokyo (JP)

( * ) Notice: Subject to any disclaimer, the term of this patent is extended or adjusted under 35 U.S.C. 154(b) by 0 days.

(21) Appl. No.: 13/653,211

(22) Filed: Oct. 16, 2012

(65) Prior Publication Data

US 2013/0092825 A1 Apr. 18, 2013

(30) Foreign Application Priority Data

Oct. 17, 2011 (JP) .................... 2011-227917

(51) Int. Cl.
- *G21K 5/04* (2006.01)
- *H01J 37/26* (2006.01)
- *H01J 37/317* (2006.01)

(52) U.S. Cl.
CPC .............. *H01J 37/26* (2013.01); *H01J 37/317* (2013.01); *H01J 2237/31701* (2013.01)
USPC .................. 250/492.3; 250/492.1; 250/492.2; 250/396 R

(58) Field of Classification Search
CPC ..... H01J 37/26; H01J 37/317; H01J 37/3171; H01J 2237/317; H01J 2237/31701
USPC ............... 250/396 R, 397, 398, 492.1, 492.2, 250/492.21, 492.22, 492.3
See application file for complete search history.

(56) References Cited

U.S. PATENT DOCUMENTS

| | | | |
|---|---|---|---|
| 6,984,833 B2* | 1/2006 | Sano et al. | 250/492.21 |
| 2004/0251432 A1* | 12/2004 | Sano et al. | 250/492.21 |

FOREIGN PATENT DOCUMENTS

JP  2000-11942 A  1/2000

* cited by examiner

*Primary Examiner* — Nicole Ippolito
(74) *Attorney, Agent, or Firm* — Arent Fox LLP

(57) ABSTRACT

During ion implantation into a wafer, an ion beam current is measured, a change in vacuum conductance which changes in accordance with a change of the location of a structure operating in a vacuum beam line chamber or a vacuum treatment chamber is obtained, furthermore, changes in degree of vacuum at one or plural places are detected using a vacuum gauge installed in the vacuum beam line chamber or the vacuum treatment chamber. The amount of an ion beam current is corrected using the obtained vacuum conductance and the detected degree of vacuum at one or plural places, and the dose amount implanted into the wafer is controlled.

9 Claims, 3 Drawing Sheets

ION IMPLANTATION APPARATUS AND ION IMPLANTATION METHOD

This application is based upon and claims the benefit of priority from Japanese Patent Application No. 2011-227917, filed on Oct. 17, 2011, the disclosure of which is incorporated herein in its entirety by reference.

BACKGROUND OF THE INVENTION

1. Field of the Invention

The present invention relates to an ion implantation apparatus and an ion implantation method, and particularly to the ion implantation amount control of an ion implantation apparatus having a function of compensating for a change in the dose amount caused by charge conversion during ion implantation using measurement of the degree of vacuum.

2. Description of Related Art

In a semiconductor-manufacturing process, it is normal to carry out a process in which ions are implanted in a semiconductor wafer for the purpose of changing conductivity, changing the crystal structure of the wafer, and the like. An apparatus used in the process is referred to as an ion implantation apparatus, and has a function of forming an ion beam which is ionized by an ion source, and then accelerated and a function of irradiating the ion beam to the entire surface of the semiconductor wafer using beam scanning, wafer scanning, or a combination thereof.

In an ion implantation process in the semiconductor-manufacturing process, generally, it is necessary to uniformly implant a target dose amount in a wafer surface, and it is normal to control the ion implantation apparatus for that purpose.

In such an ion implantation apparatus, a control operation is carried out by measuring an ion beam current value and computing an implantation dose amount from the valence of an ion implanted into a wafer, but a vacuum correction function through which the ion beam current value is corrected is proposed in order to carry out an accurate control (see JP-A-2000-11942 (Patent Document 1)). The reasons why the vacuum correction function is used are as follows.

In the ion implantation apparatus, in order to improve the beam transportation efficiency or prevent the charging up of a wafer into which ions are implanted, gas is intentionally introduced into a beam line from outside, and electrons are supplied through ionization or plasmatization of the introduced gas. A noble gas is mainly and frequently used as the introduced gas. A resist film is coated on a wafer into which ions are implanted, and an ion beam is irradiated to the resist film, thereby generating a gas caused by the resist film. Some of the introduced gas intentionally introduced into the beam line and a resist-induced gas generated through implantation of an ion beam into the wafer having the resist film stay in the beam line as residual gas. Particles in the ion beam collide with the residual gas, and convert charges in a certain proportion, thereby being neutralized. Since the particles in the ion beam which are neutralized through charge conversion cannot be measured as an ion beam current, the number of particles implanted into the wafer cannot be reliably measured such that control of the implanted dose amount becomes inaccurate. Therefore, the vacuum correction function is used in order to correct the effect of neutralizing the particles in the ion beam through collision of the ion beam with the residual gas and control the dose amount accurately.

In the vacuum correction function disclosed in Patent Document 1, a measured value of the ion beam current is represented by Im, the partial pressure value of the introduced gas introduced from outside is represented by $P_A$, a vacuum gauge-measured value is represented by P, the partial pressure value of the resist-induced gas is represented by $P-P_A$, the vacuum correction coefficient which indicates how easily the introduced gas of the ion beam is neutralized is represented by $K_A$, and the vacuum correction coefficient with respect to the resist-induced gas is represented by K. In the vacuum correction function disclosed in Patent Document 1, additionally, an implanted ion beam current $I_0$ which is supposed to be measured when the ion beam particles are not neutralized due to charge conversion is calculated, and the dose amount is controlled based on the above value. The above elements are assumed to satisfy the following formula.

$$Im = I_0 \times f(P)$$

$$f(P) = \exp[-K_A P_A - K(P-P_A)]$$

Herein, the values of the vacuum correction coefficients $K_A$ and K included in the function f(P) of pressure vary depending on the kind of the ion, the accelerated voltage of the ion beam, and the kind of the introduced gas.

In the introduced gas introduced from outside and the resist-induced gas, the proportion of particles that are neutralized when the ion beam collides varies. Therefore, it is necessary to accurately estimate the partial pressure values of the introduced gas and the resist-induced gas respectively. Nevertheless, the vacuum correction function disclosed in Patent Document 1 has a problem regarding the estimation method.

In the vacuum correction function disclosed in Patent Document 1, a vacuum gauge-measured value in a state in which a resist-induced gas before ion implantation is not generated is used as the partial pressure value $P_A$ of the introduced gas, and the partial pressure value $P_A$ is assumed to be constant at all times even during ion implantation. In addition, a value $P-P_A$ which indicates the difference between the vacuum gauge-measured value P which continuously changes every second during ion implantation and the partial pressure value $P_A$ of the introduced gas is used as the partial pressure value of the resist-induced gas.

However, as described in detail below, in the ion implantation apparatus, ordinarily, structures operating during ion implantation into a wafer are present. In addition, the mechanical operations of the structures change the vacuum conductance of the beam line. This means that the partial pressure value $P_A$ of the introduced gas significantly changes with respect to time during ion implantation.

In addition, as described in detail below, the introduced gas intentionally introduced into the beam line is not necessarily one kind; however, in the vacuum correction function disclosed in Patent Document 1, consideration of the above point is lacking.

Due to the above, in the vacuum correction function disclosed in Patent Document 1, errors occur in the partial pressure value $P_A$ of the introduced gas and the partial pressure value $P-P_A$ of the resist-induced gas obtained from the difference from the vacuum gauge-measured value P respectively. As a result, the implanted ion beam current used to control the dose amount deviates, and it becomes impossible to accurately control the dose amount.

Therefore, in order to accurately estimate the partial pressure values of plural kinds of introduced gases and the resist-induced gas respectively, it is necessary to include a conductance effect and the kinds of the introduced gases introduced into the beam line in the calculation of the respective partial pressure values in the beam line.

SUMMARY OF INVENTION

The present invention aims to provide an ion implantation method in which a neutralization effect of ion beam particles due to plural kinds of introduced gases and a resist-induced gas which stay in a beam line can be estimated including a conductance effect so as to accurately control a dose amount, and an ion implantation apparatus.

Specifically, the present invention aims to achieve the following points.

The partial pressure values of the degree of vacuum of the plural kinds of introduced gas introduced from outside and the resist-induced gas generated from a wafer in the beam line are accurately estimated including the conductance effect which is based on a change in the vacuum conductance that changes according to the location of structures operating in a vacuum beam line chamber or a vacuum treatment chamber, and the neutralizing effect of ion beam particles due to plural kinds of the introduced gases and the resist-induced gas is accurately calculated, thereby accurately controlling the dose amount.

The invention is applied to an ion implantation apparatus which is configured to transport an ion beam extracted from an ion source to the vacuum treatment chamber communicating with an end opening of the vacuum beam line through the vacuum beam line chamber, and implant the ion beam into a wafer in the vacuum treatment chamber.

One of the ion implantation methods according to the present invention is applied to an ion implantation apparatus comprising a ion beam current measurement unit for measuring the ion beam current during ion implantation and a vacuum measurement unit for measuring the degree of vacuum using a vacuum gauge. The ion implantation apparatus has a vacuum correction function in which a change in the vacuum conductance which changes due to the change of the position of structures operating in the vacuum beam line chamber or the vacuum treatment chamber during ion implantation into a wafer is obtained, changes in one or plural degrees of vacuum are detected using the vacuum gauge, the amount of the ion beam current is corrected using the obtained change in the vacuum conductance and the detected change in one or plural degrees of vacuum, and the dose amount implanted into the wafer is controlled.

In addition, The ion implantation apparatus may have a vacuum correction function in which the dose amount is controlled based on an implanted ion beam current calculated by the use of vacuum correction coefficients with respect to the introduced gas introduced from outside and the resist-induced gas which have been obtained in advance and of the respective partial pressure values of the degree of vacuum including the conductance effect with respect to the above gases.

The invention further has a vacuum correction function in which, even in a case in which plural introduced gases are introduced from outside, the vacuum correction coefficients of an ion beam with respect to the introduced gases and the partial pressure values of the degree of vacuum including the conductance effect are respectively calculated, and the dose amount is controlled based on a converted implanted ion beam current.

Additionally, the invention also has a function in which, besides the influences of the introduced gases and the resist-induced gas, a change in the number of ion beam particles that reach the wafer is monitored at all times during ion implantation into the wafer, and, in a case in which the number of particles implanted into the wafer is changed during ion implantation, the ion implantation into the wafer is stopped.

According to the invention, a high-precision ion implantation method in which the dose amount implanted into the wafer can be controlled can be realized by accurately estimating the partial pressure values of the degree of vacuum of plural kinds of the introduced gases introduced from outside and the resist-induced gas generated from the wafer in the vacuum beam line chamber in consideration of the conductance effect which is based on a change in the vacuum conductance which changes according to the changes in the location of structures operating in the vacuum beam line chamber or the vacuum treatment chamber, and accurately correcting the measured ion beam current to an ion beam current which is based on the number of ion beam particles that are actually implanted into the wafer.

According to the invention, a high-precision ion implantation apparatus which controls the dose amount implanted into a wafer can be achieved by accurately estimating the partial pressure values of the degree of vacuum of plural kinds of the introduced gases introduced from outside and the resist-induced gas generated from the wafer in the vacuum beam line chamber in consideration of the conductance effect, and accurately correcting the measured ion beam current to an ion beam current which is based on the number of ion beam particles that are actually implanted into the wafer.

DESCRIPTION OF THE PREFERRED EMBODIMENTS

The present invention is applied to an ion implantation apparatus which is configured to transport an ion beam extracted from an ion source to a vacuum treatment chamber communicating with an end opening of a vacuum beam line through a vacuum beam line chamber, and implant the ion beam into a wafer in the vacuum treatment chamber. However, there are plural kinds of ion implantation apparatuses. Since it becomes cumbersome to explain all kinds of ion implantation apparatuses, hereinafter, a single-wafer-type ion implantation apparatus will be described as a typical example of the ion implantation apparatus. In the following description, an ion beam transportation system ranging from an ion source to the vacuum treatment chamber will be referred to as a beam line, and a chamber that accommodates components of the ion beam transportation system will be referred to as a vacuum beam line chamber. The vacuum treatment chamber communicates with an end opening of a vacuum beam line in the vacuum beam line chamber.

Figure 1:
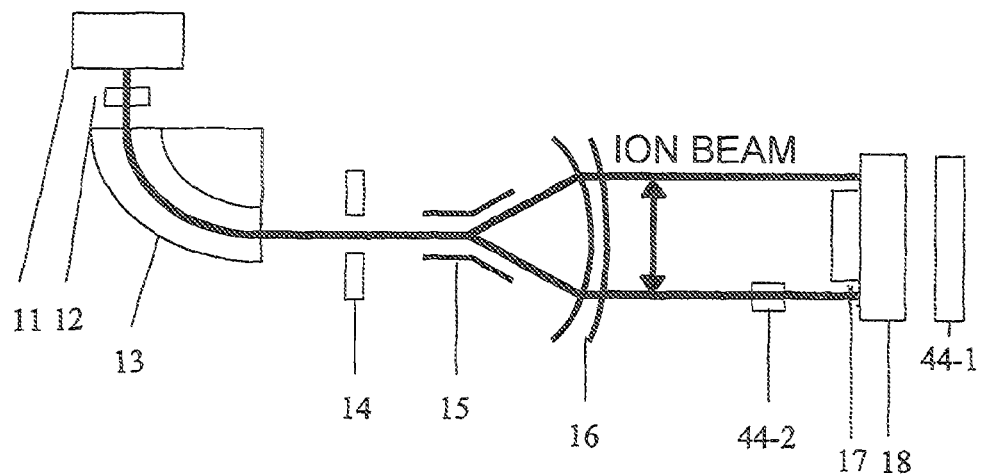
FIG. 1 is a schematic configuration view for explaining an example of an ion implantation apparatus to which the invention can be applied.

The configuration of a typical single-wafer-type ion implantation apparatus which is termed a hybrid scan-type will be described as an example of an ion implantation apparatus to which the invention is applied with reference to FIG. 1.

In the ion implantation apparatus, an ion beam extracted from an ion source 11 using an extraction electrode 12 is transported to a wafer through the vacuum beam line chamber. A mass analysis magnetic apparatus 13 (deflection using a magnetic field), a mass analysis slit 14, a beam scanner 15, and a parallel lens 16 are sequentially disposed along the beam line. Although not shown in FIG. 1, an energy analyzer (indicated by 22 in FIGS. 2A and 2B), an energy analysis slit, and the vacuum treatment chamber (indicated by 30 in FIGS. 2A and 2B) are further sequentially disposed on the downstream side of the parallel lens 16. In the vacuum treatment chamber, a wafer scanning apparatus (hereinafter sometimes referred to as a mechanical scanning apparatus) for moving a holder 18 that is a wafer scanning body and that holds a wafer 17 is disposed in the vacuum treatment chamber. An ion beam extracted from the ion source 11 is guided to the wafer 17 on the holder 18 disposed in the vacuum treatment chamber along the beam line.

In the ion implantation apparatus, generally, there are cases in which electrons are supplied to an ion beam at plural locations in the beam line in order to cancel the space-charge effect so as to increase the ion beam transportation efficiency, or in order to prevent charging up of the wafer 17. Needless to say, even in the single-wafer-type ion implantation apparatus, there are cases in which such electron supply is carried out. In this case, as a supply source of electrons, it is common to introduce a gas from outside intentionally. Generally, it is common to introduce plural kinds of noble gases such as argon, krypton, and xenon according to purpose.

Here, in the single-wafer-type ion implantation apparatus, in order to implant ions into the entire wafer surface, it is common to drive the wafer 17 to mechanically reciprocate on a line in a direction at an inclination angle set in advance with respect to the ion beam incident direction, or to fix a location at which an ion beam is irradiated and drive the wafer 17 to mechanically reciprocate on a line in a direction so that the wafer passes through the fixed irradiation location. For example, in the single-wafer-type ion implantation apparatus termed a hybrid scanning type as shown in FIG. 1, an ion beam is scanned (or irradiated) so as to scan (or reciprocate) in a line in an ion beam scanning direction in the vacuum beam line chamber. Meanwhile, the wafer 17 in the vacuum treatment chamber is made to move (or scan) mechanically in a direction substantially perpendicular to the ion beam scanning direction.

Meanwhile, on the downstream side of the wafer 17, a back Faraday cup 44-1 that measures the ion beam current when the wafer 17 is not in the scanning range of an ion beam is disposed. Meanwhile, in the scanning range of an ion beam away from the wafer 17 on the upstream side close to the wafer 17, a side Faraday cup 44-2 that measures the ion beam current during ion implantation is disposed. The Faraday cups are components for detecting the dose amount, and are also referred to as dose cups.

In addition, in an ion implantation apparatus termed a batch-type ion implantation apparatus, plural wafers are disposed at angular intervals on the same circumference as the circumference of a rotary structure termed a disc. The disc is rotated at a high frequency so that the respective wafers traverse the ion beam irradiated at the fixed location, and the disc is translated in one direction, thereby implanting ions into the entire surfaces of the plural wafers.

Accordingly, in an ion implantation apparatus configured to transport an ion beam drawn from the ion source 11 to the vacuum treatment chamber communicating with the end opening of the vacuum beam line through the vacuum beam line chamber, and implant the ion beam into the wafer 17 in the vacuum treatment chamber, it is normal that any structures operating in the vacuum beam line chamber or the vacuum treatment chamber may be present during ion implantation into the wafer 17.

Meanwhile, the vacuum beam line chamber and the vacuum treatment chamber are made to remain in a vacuum state using a vacuum exhaust apparatus. The degree of vacuum of the vacuum beam line chamber and the vacuum treatment chamber are determined by the amount of an ion beam, the amount of an introduced gas intentionally introduced from outside, the amount of a resist-induced gas generated from a resist coated on the wafer 17, the amount of gas exhausted from the structures present in the vacuum beam line chamber and the vacuum treatment chamber, and the vacuum conductance with respect to the vacuum exhaust apparatus. Among them, the vacuum conductance is determined by the mechanical location of the structures present in the vacuum beam line chamber and the vacuum treatment chamber. In other words, in a case in which any structures operating in the vacuum beam line chamber or the vacuum treatment chamber may be present, the vacuum conductance changes depending on the location, and therefore the degree of vacuum also changes.

Here, for example, for the vacuum correction function disclosed in Patent Document 1, the vacuum gauge-measured value P in a state in which the resist-induced gas before ion implantation is not generated is used as the partial pressure value $P_A$ of the introduced gas, and the partial pressure value is assumed to remain constant at all times even during ion implantation. However, in the ion implantation apparatus, mechanically operating structures are present during ion implantation into the wafer 17. When the structures operate mechanically, the vacuum conductance of the beam line changes. However, Patent Document 1 does not review a change in the vacuum conductance induced from the structures.

In the ion implantation apparatus configured to transport an ion beam extracted from the ion source 11 to the vacuum treatment chamber through the vacuum beam line chamber, and implant the ion beam into the wafer 17 in the vacuum treatment chamber, in a case in which any structures operating in the vacuum beam line chamber or the vacuum treatment chamber may be present, it is reasonable that the vacuum conductance changes, and the partial pressure value changes due to a resultant change in the degree of vacuum; however, herein, the case of the typical single-wafer-type ion implantation apparatus termed a hybrid scanning type will be described in more detail for the convenience of understanding.

Figure 2A:
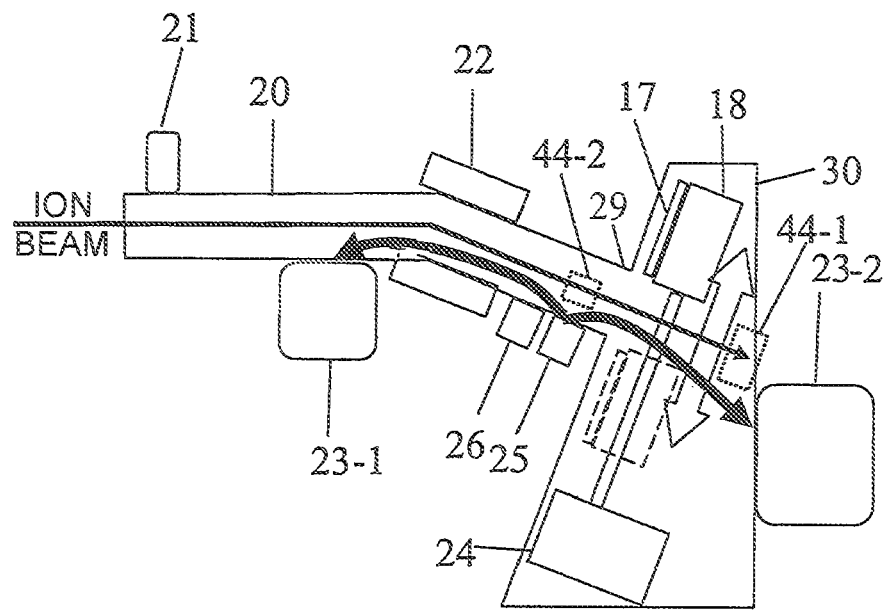
FIGS. 2A and 2B are schematic views that explain a vacuum conductance effect in an ion implantation apparatus.
Figure 2B:
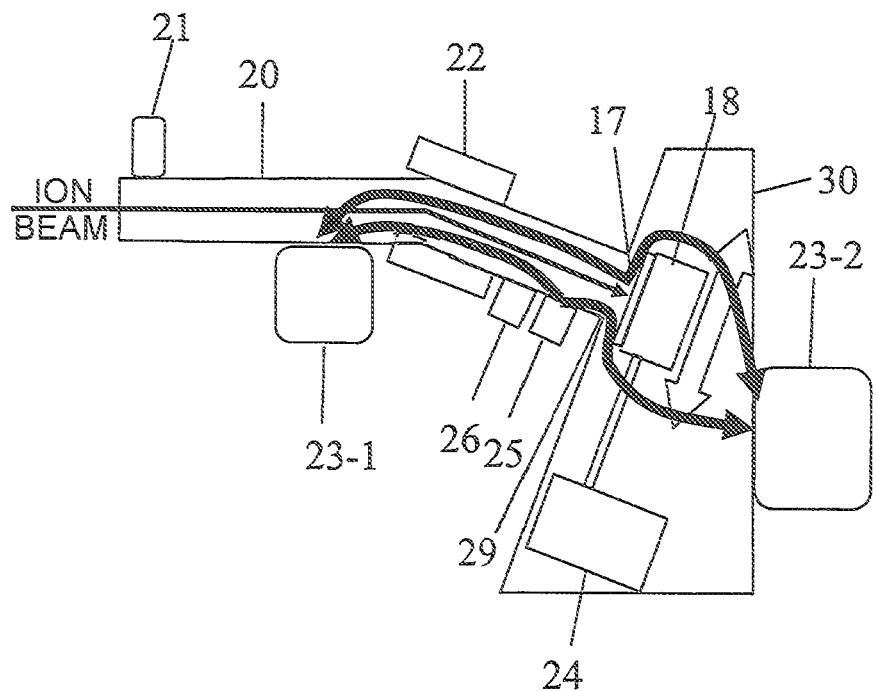

The conductance effect in which the partial pressure value $P_A$ of the introduced gas does not become constant during ion implantation will be further described with reference to FIGS. 2A and 2B. FIGS. 2A and 2B show a vacuum beam line chamber 20 on the downstream side of the parallel lens 16 shown in FIG. 1 and a vacuum treatment chamber 30 communicating with an end opening 29 of the vacuum beam line. In the following description, the introduced gas introduced from outside and the resist-induced gas will be collectively referred to as the residual gas. In the vacuum treatment chamber 30, the wafer 17 is held with the holder 18 (that is a wafer scanning body) as described above. The holder 18 is driven in the vertical direction in FIGS. 2A and 2B using an elevating apparatus 24 that serves a wafer scanning apparatus (a mechanical scanning apparatus). In other words, when an ion beam is implanted into the wafer 17, the wafer 17 is moved vertically (up and down) using the elevating apparatus 24 so that a uniform implanted dose amount is obtained across the entire wafer surface. FIGS. 2A and 2B show the energy spectrometer 22. In a case in which ion beam particles are neutralized due to collision with the residual gas at the upstream of the energy spectrometer 22, the neutralized particles do not reach the wafer 17. On the other hand, in a case in which ion beam particles are neutralized due to collision with the residual gas at the downstream of the energy spectrometer 22, the neutralized particles reach the wafer 17. As such, there is a remarkable difference between particles neutralized at the upstream of the energy spectrometer 22 and particles neutralized at the downstream of the energy spectrometer 22.

FIGS. 2A and 2B shows two vacuum exhaust apparatuses 23-1 and 23-2 using a vacuum pump. One vacuum exhaust apparatus 23-1 is disposed in the vacuum beam line chamber 20, and the other vacuum exhaust apparatus 23-2 is disposed in the vacuum treatment chamber 30. The number and disposition locations of the vacuum exhaust apparatuses are simply an example, and are not limited to the example in FIGS. 2A and 2B. In addition, in FIGS. 2A and 2B, an introduced gas A introduction apparatus 25 and an introduced gas B introduction apparatus 26 are disposed in parallel in the vacuum beam line chamber. The introduced gas introduction apparatuses are also referred to as plasma showers, the number and disposition locations thereof are also an example, and are not limited to the example in FIGS. 2A and 2B. Furthermore, in FIGS. 2A and 2B, a single vacuum gauge head 21 is provided in the vacuum beam line chamber 20 on the upstream side of the energy spectrometer 22. The number and disposition location of the vacuum gauge heads are also an example, and are not limited to the example in FIGS. 2A and 2B.

Herein, in a case in which the wafer 17 is present at the top location shown by a solid line in FIG. 2A or at the bottom location shown by a broken line, the residual gas is exhausted using both the vacuum exhaust apparatus 23-1 disposed in the vacuum beam line chamber 20 and the vacuum exhaust apparatus 23-2 disposed in the vacuum treatment chamber 30. The thick arrow shown in FIG. 2A shows the vacuum conductance between the introduced gas A introduction apparatus 25 and the vacuum exhaust apparatuses 23-1 and 23-2. As shown in FIG. 2B, the wafer 17 approaches the end opening 29 of the vacuum beam line, that is, the center of the ion beam irradiation area in accordance with movement of the wafer 17. In this case, the wafer 17 and the wafer scanning body become the structures operating in the vacuum beam line chamber or the vacuum treatment chamber. When the wafer 17 and the wafer scanning body move to a location at which the wafer and the wafer scanning body overlap the end opening 29 of the vacuum beam line, it becomes difficult to exhaust the residual gas due to deterioration of the vacuum conductance with respect to the vacuum exhaust apparatus 23-2. The thick arrow toward the vacuum exhaust apparatus 23-2 in FIG. 2B shows the above. In other words, for easy understanding, the exhaust path toward the vacuum exhaust apparatus 23-2 is blocked due to the wafer 17 and the wafer scanning body such that the vacuum conductance deteriorates, and thus the degree of vacuum also deteriorates.

For example, for the vacuum correction function disclosed in Patent Document 1, the vacuum gauge-measured value P in a state in which the resist induced gas before ion implantation is not generated is used as the partial pressure value $P_A$ of the introduced gas. In addition, the partial pressure value $P_A$ is assumed to remain constant at all times even during ion implantation, and a value $P-P_A$ which indicates the difference between the vacuum gauge-measured value P which continuously changes every second during ion implantation and the partial pressure value $P_A$ of the introduced gas is assumed to be the partial pressure value of the resist-induced gas. However, as is evident in description using FIGS. 2A and 2B, when the effect of deterioration of the degree of vacuum due to deterioration of the vacuum conductance is taken into account, the partial pressure value of the introduced gas during ion implantation changes compared to before ion implantation. In the case of FIGS. 2A and 2B, the partial pressure value of the introduced gas during ion implantation becomes large compared to before ion implantation. However, in general, there are cases in which the partial pressure value of the introduced gas during ion implantation may become larger or smaller than the partial pressure value of the introduced gas before ion implantation depending on the operating method of the structures operating in the vacuum beam line chamber or the vacuum treatment chamber, the disposition locations of a plurality of the vacuum exhaust apparatuses, and the disposition location of the vacuum gauge head. Therefore, the partial pressure value of the introduced gas during ion implantation into the wafer 17 is not the vacuum gauge-measured value in a state in which the resist-induced gas before ion implantation is not generated. In addition, the partial pressure value of the resist-induced gas during ion implantation into the wafer 17 is not the value $P-P_A$ which indicates the difference between the vacuum gauge-measured value P which continuously changes every second during ion implantation and the partial pressure value $P_A$ of the introduced gas.

In the present invention, during ion implantation into the wafer 17, a change in the vacuum conductance which changes due to the change of the position of the structures operating in the vacuum beam line chamber or the vacuum treatment chamber is computed (or calculated), and changes in one or plural degrees of vacuum are detected using the vacuum gauge installed in the vacuum beam line chamber or the vacuum treatment chamber. In addition, during ion implantation, the partial pressure values of the respective introduced gases which can be plump kinds and the partial pressure value of the resist-induced gas are precisely and accurately obtained from the above values.

What is important here is that the vacuum conductance is determined by the mechanical location of the structures present in the vacuum beam line chamber and the vacuum treatment chamber. In the ion implantation apparatus, an effect with respect to values of the vacuum conductance or the degrees of vacuum of the structures operating in the vacuum beam line chamber or the vacuum treatment chamber at the respective locations in the driving range is obtained through computation or experiment. In this case, a change in the vacuum conductance which changes due to the change of the position of the structures operating in the vacuum beam line chamber or the vacuum treatment chamber is obtained by obtaining the location information of the structures operating in the vacuum beam line chamber or the vacuum treatment chamber during ion implantation, whereby the partial pressure values of the respective introduced gases which can be plural kinds and the partial pressure value of the resist-induced gas can be obtained precisely and accurately during the ion implantation. As the location information, for example, the location information of the wafer scanning body (holder 18) can be obtained from the wafer scanning apparatus (mechanical scanning apparatus).

Here, as an example, in the case of FIGS. 2A and 2B, it becomes difficult to exhaust the residual gas as the wafer 17 approaches the center of the ion beam irradiation area, particularly, due to deterioration of the vacuum conductance with respect to the vacuum exhaust apparatus 23-2 present in the vacuum treatment chamber 30. Therefore, it becomes possible to control the dose amount implanted into the wafer 17 as described below by, during ion implantation, obtaining a change in the vacuum conductance in advance as a function of the location of the wafer scanning body in the wafer scanning direction which is installed in the vacuum treatment chamber 30 for mechanically scanning the wafer 17, and precisely and accurately obtaining the partial pressure values of the respective introduced gases which can be plural kinds and the partial pressure value of the resist-induced gas in accordance with a change in the location of the wafer scanning body which occurs during ion implantation.

Here, the single-wafer-type ion implantation apparatus termed a hybrid scanning type in which a vacuum exhaust apparatus, a wafer scanning body provided in the vacuum treatment chamber in order to mechanically scan (or move) a wafer, and a wafer are disposed will be considered. For an example of the single-wafer-type ion implantation apparatus, how the effect of deterioration of the degree of vacuum due to a change in the vacuum conductance with respect to one kind of introduced gas introduced from outside changes due to the location of the wafer scanning body was measured. As a result, the partial pressure value $P_A$ of the introduced gas during ion implantation could be expressed by the following formula.

$$P_A = [-a(Y-Ya)(Y+Ya)+1] \cdot P_{A0}.$$

Herein, Y represents the location of the wafer scanning body installed in the vacuum treatment chamber in order to mechanically scan (or move) the wafer in the wafer scanning direction, and Ya and a are integers. $P_{A0}$ represents the degree of vacuum in a case in which an introduced gas introduced from outside is present which is measured before ion implantation. The spatial location of the wafer scanning body and the wafer at the time of the measurement before ion implantation is the top location or the bottom location in the driving range of the wafer scanning body in FIGS. 2A and 2B. That is, the degree of vacuum $P_{A0}$ is the degree of vacuum in a case in which the wafer scanning body is located at a location at which the vacuum conductance due to the vacuum exhaust apparatus 23-2 installed in the vacuum treatment chamber 30 is largest.

In the case of an introduced gas introduced from a different location or a different kind of introduced gas, the effect of deterioration of the degree of vacuum due to a change in the vacuum conductance is naturally different, and, for example, the partial pressure value $P_B$ of the introduced gas during ion implantation becomes $$P_B = [-b(Y-Yb)(Y+Yb)+1] \cdot P_{B0}.$$

Herein, Y represents the location of the wafer scanning body installed in the vacuum treatment chamber 30 in order to mechanically scan (or move) the wafer 17 in the wafer scanning direction, and Yb and b are integers. $P_{B0}$ represents the degree of vacuum in a case in which an introduced gas introduced from outside is present which is measured before ion implantation. The spatial location of the wafer scanning body and the wafer 17 at the time of the measurement before ion implantation is the top location or the bottom location in the driving range of the wafer scanning body in FIGS. 2A and 2B.

Meanwhile, in a case in which disposition of the vacuum exhaust apparatus or disposition of the wafer scanning body installed in the vacuum treatment chamber 30 in order to mechanically scan (or move) the wafer 17 and the wafer 17 are different, and the like, it is needless to say that the form of the above formula changes. What is important here is that, regarding the effect of deterioration of the degree of vacuum due to a change in the vacuum conductance, the partial pressure values of the respective introduced gases which can be plural kinds and the partial pressure value of the resist-induced gas can be obtained precisely and accurately during ion implantation by obtaining the location information of the structures operating in the vacuum beam line chamber 20 or the vacuum treatment chamber 30.

Here, a case in which plural introduced gases are introduced from outside will be described in more detail. Here, two kinds of introduced gases, that is, an introduced gas A and an introduced gas B will be considered. For example, in FIGS. 2A and 2B, the introduced gas A is introduced from the introduced gas A introduction apparatus 25, and the introduced gas B is introduced from the introduced gas B introduction apparatus 26. In this case, it is not possible to estimate the partial pressure values of the introduced gas A and the introduced gas B respectively from the vacuum value measured before ion implantation into the wafer 17 using a single vacuum gauge alone. Therefore, the partial pressure value of the resist-induced gas during ion implantation cannot be obtained precisely and accurately. That is, it is necessary to obtain a ratio of the partial pressure values between the introduced gas A and the introduced gas B in advance.

The following method can be considered as one of methods for obtaining the ratio of the partial pressure values between the introduced gas A and the introduced gas B. A plural number of vacuum gauges are disposed in the vacuum beam line chamber and the vacuum treatment chamber, and the difference in the vacuum conductance with respect to the disposal locations of the vacuum gauges is used, thereby obtaining the ratio of the partial pressure values between the introduced gas A and the introduced gas B in advance from the plural number of vacuum gauge-measured values.

The following method can be considered as another method for obtaining the ratio of the partial pressure values between the introduced gas A and the introduced gas B. A mass flow meter installed in the ion implantation apparatus is used, and the amounts of the introduced gas A and the introduced gas B introduced to the ion implantation apparatus are precisely and accurately measured, thereby obtaining the ratio of the partial pressure values between the introduced gas A and the introduced gas B in advance, in this case, the number of the vacuum gauges may be one.

Here, in a case in which plural introduced gases are introduced from outside, which of the above methods will be used is selected from different viewpoints of costs and the like.

Figure 3:
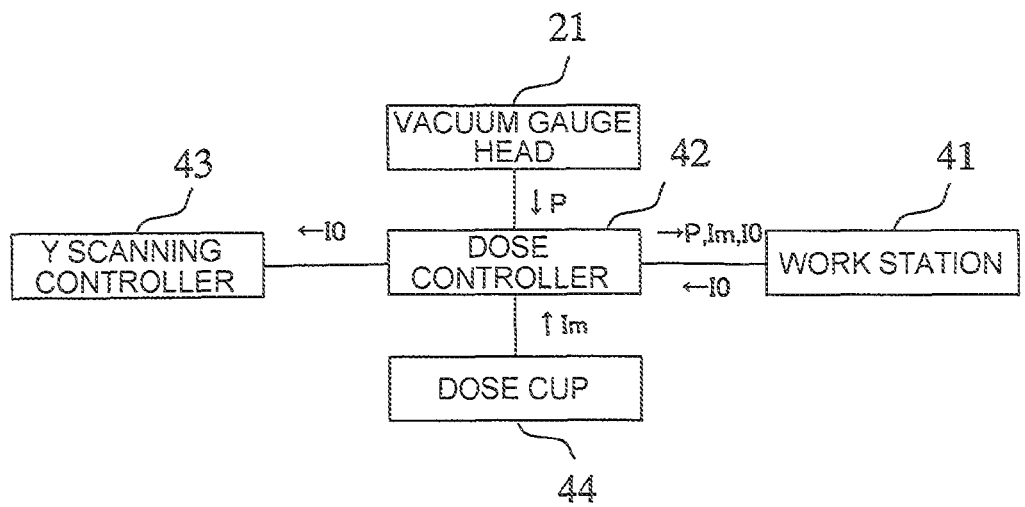
FIG. 3 is a block diagram showing the configuration of a dose amount controlling system in an ion implantation apparatus to which the invention can be applied.

Here, an example of a dose amount controlling system in the ion implantation apparatus used in the invention will be described with reference to FIG. 3. For simple description, the number of the introduced gases used is considered to be one. The vacuum gauge head 21 installed in the ion implantation apparatus measures the degree of vacuum of the vacuum beam line chamber 20 so as to output a signal showing the vacuum gauge-measured value P, and the dose cup 44 measures an ion beam current so as to output a signal showing an ion beam current Im. A work station 41 performs sampling of the ion beam current Im and the vacuum gauge-measured value P at a constant frequency through a dose controller 42, and stores the sampled values in a storage apparatus (not shown). The work station 41 computes an implanted ion beam current $I_0$ by the use of the ion beam current Im, the introduced gas partial pressure value $P_A$ obtained in advance, and the vacuum gauge-measured value P, and sends the computed implanted ion beam current $I_0$ to the dose controller 42. The dose controller 42 controls the dose amount through a Y scanning controller 43 using the computed implanted ion beam current $I_0$. The Y scanning controller 43 is for controlling the elevating apparatus 24, that is for controlling the vertical driving of the wafer scanning apparatus.

The control of the dose amount into the wafer 17 will be described in more detail. The control of the dose amount can include a control of the absolute value of the dose amount that is supposed to be implanted into the wafer 17 and a control of the uniformity of the dose amount in a wafer surface. In the present invention, the partial pressure value of the introduced gas that is intentionally and regularly implanted into the ion implantation apparatus and the partial pressure value of the resist-induced gas that is collaterally generated from the resist film on the wafer surface due to ion implantation are precisely and accurately obtained. In addition, the effects of the introduced gas on the ion beam and the effect of the resist-induced gas are calculated respectively, an ion beam current amount is corrected based on the calculated values, and the dose amount implanted into the wafer 17 is controlled. In this case, it is possible to match the absolute value of the dose amount to a target dose amount, and the uniformity of the dose amount in the wafer surface also can be improved. Here, for simple description, the effects of the present invention will be described using the uniformity of the dose amount into the wafer surface.

Figure 4:
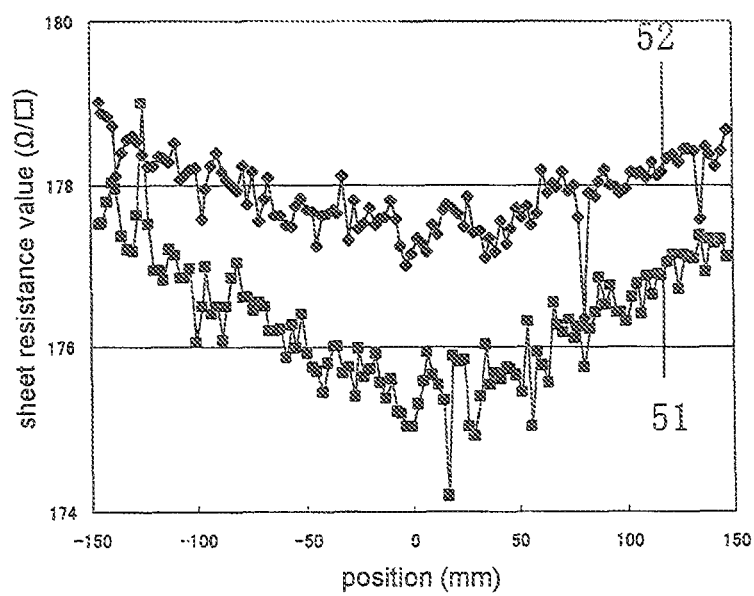
FIG. 4 is a characteristic view for comparing the uniformity of the dose amount in a wafer surface before and after the application of the present invention.

FIG. 4 shows an example in which a specific problem is actually solved using the present invention. The present invention was applied to one of typical single-wafer-type ion implantation apparatuses termed a hybrid scanning type, and the effect of controlling the dose amount using the present invention was confirmed using the actual wafer 17. FIG. 4 shows the measured values of sheet resistance values that are frequently used for measurement of the dose amount into the wafer. The horizontal axis in FIG. 4 indicates the location of the wafer in the radial direction, and the center in the radial direction is represented by 0. Therefore, as the sheet resistance value looks more like a straight line, the uniformity of the dose amount into the wafer surface becomes more favorable.

As shown in FIG. 4, it was confirmed that the uniformity of the dose amount into the wafer surface could be improved from 0.42% which was a value when the present invention was not in use obtained from the measurement results of the sheet resistance value 51 when the present invention was not in use to 0.24% which was a value when the present invention was in use obtained from the measurement results of the sheet resistance value 52 when the invention was in use, and the effects of the invention are evident.

Thus far, the preferable embodiment of the invention has been described, but the invention may be carried out in the following aspects.

[Aspect 1]
A plurality of vacuum gauges are installed in the vacuum beam line chamber and the vacuum treatment chamber,
the partial pressure values of one or more introduced gases that are intentionally and regularly introduced into the ion implantation apparatus and the partial pressure value of the resist-induced gas that is collaterally generated from the resist film on the wafer surface due to ion implantation are obtained from the plurality of vacuum gauge-measured values respectively,
the effects of the one or more introduced gases on the ion beam and the effect of the resist-induced gas are calculated respectively, the ion beam current amount is corrected based on the calculation results, and the dose amount implanted into the wafer is controlled.

[Aspect 2]
The partial pressure values of one or more introduced gases that are intentionally and regularly introduced into the ion implantation apparatus are obtained using a single vacuum gauge and a mass flow meter installed in the ion implantation apparatus before ion implantation into the wafer,
the partial pressure value of the resist-induced gas that is collaterally generated from the resist film on the wafer surface due to ion implantation is obtained using the single vacuum gauge,
the effects of the one or more introduced gases on the ion beam and the effect of the resist-induced gas are calculated respectively, the ion beam current amount is corrected based on the calculation results, and the dose amount implanted into the wafer is controlled.

[Aspect 3]
The partial pressure values of one or more introduced gases that are intentionally and regularly introduced into the ion implantation apparatus which are obtained before ion implantation into the wafer are obtained by setting the location of the wafer scanning body at the location at which the vacuum conductance due to a vacuum pump installed in the vacuum treatment chamber is largest as the location of the wafer scanning body in the wafer scanning direction which is installed in the vacuum treatment chamber in order to mechanically scan (or move) the wafer,
the measurement results of the partial pressure value of the resist-induced gas that is collaterally generated from the resist film on the wafer surface which is carried out during ion implantation, the effects of the one or more introduced gases on the ion beam, and the effect of the resist-induced gas are calculated respectively, the ion beam current amount is corrected based on the calculation results, and the dose amount implanted into the wafer is controlled.

[Aspect 4]
In any one of the aspects 1 to 3,
besides the influences of the one or more introduced gases and the resist-induced gas that is collaterally generated from the resist film on the wafer surface due to ion implantation, a change in the number of ion beam particles that reach the wafer is monitored, and
in a case in which the number of particles is changed during ion implantation, the ion implantation into the wafer is stopped.

What is claimed is:

1. An ion implantation method used in an ion implantation apparatus configured to transport an ion beam extracted from an ion source to a vacuum treatment chamber communicating with an end opening of a vacuum beam line through a vacuum beam line chamber, and implant the ion beam into a wafer in the vacuum treatment chamber,
wherein, during ion implantation into the wafer, an ion beam current is measured, a change in vacuum conductance which changes in accordance with a change of a location of a structure operating in a vacuum beam line chamber or the vacuum treatment chamber is obtained, and, furthermore, changes in degree of vacuum at one or plural places are detected using a vacuum gauge installed in the vacuum beam line chamber or the vacuum treatment chamber,
wherein an amount of an ion beam current is corrected using the obtained change in the vacuum conductance and the detected degree of vacuum at one or plural places, and a dose amount implanted into the wafer is controlled, and
wherein the ion implantation apparatus is configured such that the ion beam is irradiated by beam scanning so as to scan in a line in an ion beam scanning direction in the vacuum beam line chamber, and the wafer in the vacuum treatment chamber is mechanically moved in a direction substantially perpendicular to the ion beam scanning direction.

2. The ion implantation method according to claim 1, wherein the structure includes a wafer and a wafer scanning body installed in the vacuum treatment chamber in order to mechanically move the wafer in a wafer scanning direction, and a change in the vacuum conductance which changes due to a change in a location of the structure is obtained, a change in one or plural degrees of vacuum is detected using a separate vacuum gauge, the amount of the ion beam current is corrected using the obtained change in the vacuum conductance and the detected change in one or plural degrees of vacuum, and the dose amount implanted into the wafer is controlled.

3. The ion implantation method according to claim 2, wherein a change in the vacuum conductance as a function of a location of the wafer scanning body in a wafer scanning direction which is installed in the vacuum treatment chamber in order to mechanically move the wafer is obtained, and the dose amount implanted into the wafer is controlled in accordance with a change in the location of the wafer scanning body which occurs during ion implantation.

4. The ion implantation method according to claim 2, wherein the partial pressure values of one or more introduced gases that are intentionally and regularly introduced into the ion implantation apparatus are obtained using a vacuum gauge and a mass flow meter installed in the ion implantation apparatus before ion implantation into the wafer, the partial pressure value of the resist-induced gas that is collaterally generated from the resist film on the wafer surface due to ion implantation is obtained using the vacuum gauge, and the effects of the one or more introduced gases on the ion beam and the effect of the resist-induced gas are calculated respectively, the ion beam current amount is corrected based on the calculation results, and the dose amount implanted into the wafer is controlled.

5. The ion implantation method according to claim 4, wherein the partial pressure values of one or more introduced gases that are intentionally and regularly introduced into the ion implantation apparatus which are obtained before ion implantation into the wafer are obtained by setting the location of the wafer scanning body at the location at which the vacuum conductance due to a vacuum pump installed in the vacuum treatment chamber is largest as the location of the wafer scanning body in the wafer scanning direction, and the measurement results of the partial pressure value of the resist-induced gas that is collaterally generated from the resist film on the wafer surface which is carried out during ion implantation, the effects of the one or more introduced gases on the ion beam, and the effect of the resist-induced gas are calculated respectively, the ion beam current amount is corrected based on the calculation results, and the dose amount implanted into the wafer is controlled.

6. The ion implantation method according to claim 1, wherein a plurality of vacuum gauges are installed in the vacuum beam line chamber and the vacuum treatment chamber, the partial pressure values of one or more introduced gases that are intentionally and regularly introduced into the ion implantation apparatus and the partial pressure value of the resist-induced gas that is collaterally generated from the resist film on the wafer surface due to ion implantation are obtained from the plurality of vacuum gauge-measured values respectively, effects of the one or more introduced gases on the ion beam and an effect of the resist-induced gas are calculated respectively, the amount of the ion beam current is corrected based on the calculation results, and the dose amount implanted into the wafer is controlled.

7. The ion implantation method according to claim 6, wherein, besides the influences of the one or more introduced gases and the resist-induced gas that is collaterally generated from the resist film on the wafer surface due to ion implantation, a change in the number of ion beam particles that reach the wafer is monitored, and in a case in which the number of particles is changed during ion implantation, the ion implantation into the wafer is stopped.

8. An ion implantation apparatus configured to transport an ion beam extracted from an ion source to a vacuum treatment chamber communicating with an end opening of a vacuum beam line through a vacuum beam line chamber, and implant the ion beam into a wafer in the vacuum treatment chamber, wherein, during ion implantation into the wafer, a change in vacuum conductance which changes in accordance with a change of the position of a structure operating in a vacuum beam line chamber or the vacuum treatment chamber is obtained, and, changes in one or plural degrees of vacuum are detected using a vacuum gauge installed in the vacuum beam line chamber or the vacuum treatment chamber, and wherein the ion implantation apparatus comprises a controller that corrects an amount of an ion beam current by using the obtained change in the vacuum conductance and the detected change in one or plural degrees of vacuum, and that corrects a dose amount implanted into the wafer, and wherein the ion beam is irradiated by beam scanning so as to scan in a line in an ion beam scanning direction in the vacuum beam line chamber, and the wafer in the vacuum treatment chamber is mechanically moved in a wafer scanning direction substantially perpendicular to the ion beam scanning direction.

9. The ion implantation apparatus according to claim 8, wherein the structure includes a wafer and a wafer scanning body installed in the vacuum treatment chamber in order to mechanically move the wafer, and a change in the vacuum conductance which changes due to a change in a location of the structure is obtained, a change in one or plural degrees of vacuum is detected using a separate vacuum gauge, the controller corrects the amount of the ion beam current by using the obtained change in the vacuum conductance and the detected change in one or plural degrees of vacuum, and then controls the dose amount implanted into the wafer.

* * * * *